(12) United States Patent
Tabatabaei et al.

(10) Patent No.: US 7,675,450 B1
(45) Date of Patent: Mar. 9, 2010

(54) DIGITAL-TO-ANALOG CONVERTER (DAC) FOR HIGH FREQUENCY AND HIGH RESOLUTION ENVIRONMENTS

(75) Inventors: Ali Tabatabaei, San Francisco, CA (US); Ramin Farjadrad, Los Altos, CA (US)

(73) Assignee: Aquantia Corporation, Milpitas, CA (US)

( * ) Notice: Subject to any disclaimer, the term of this patent is extended or adjusted under 35 U.S.C. 154(b) by 0 days.

(21) Appl. No.: 12/139,447

(22) Filed: Jun. 13, 2008

Related U.S. Application Data

(60) Provisional application No. 60/943,828, filed on Jun. 13, 2007.

(51) Int. Cl.
H03M 1/66 (2006.01)
(52) U.S. Cl. .................. 341/145; 341/144; 341/146
(58) Field of Classification Search ......... 341/144–146; 455/127.1
See application file for complete search history.

(56) References Cited

U.S. PATENT DOCUMENTS

| | | | | |
|---|---|---|---|---|
| 5,036,322 A | * | 7/1991 | Barrow et al. | 341/144 |
| 5,703,586 A | * | 12/1997 | Tucholski | 341/144 |
| 5,949,362 A | * | 9/1999 | Tesch et al. | 341/144 |
| 6,265,857 B1 | * | 7/2001 | Demsky et al. | 323/312 |
| 2007/0129030 A1 | * | 6/2007 | Litmanen et al. | 455/127.1 |

* cited by examiner

*Primary Examiner*—Jean B Jeanglaude
(74) *Attorney, Agent, or Firm*—Sawyer Law Group, P.C.

(57) ABSTRACT

A digital-to-analog converter (DAC) configured to operate in high frequency and/or high resolution environments. The DAC has a segmented architecture comprising one or more least significant bit (LSB) thermometer sub-converters and one or more most significant bit (MSB) thermometer sub-converters. A binary converter can also be added. The LSB and MSB thermometer sub-converters include cell pairs with a main cell and a dummy cell. The main cell switches according to actual data, drawing power from a voltage source at each transition. To maintain a consistent voltage level at the output, the dummy cell creates a transition to draw power from the voltage source responsive to a lack of transition in the main cell. Each cell pair has a dedicated voltage source. Also, the MSB thermometer sub-converter can include a load matching circuit to match the parasitic capacitance of the LSB thermometer sub-converter at an output.

18 Claims, 4 Drawing Sheets

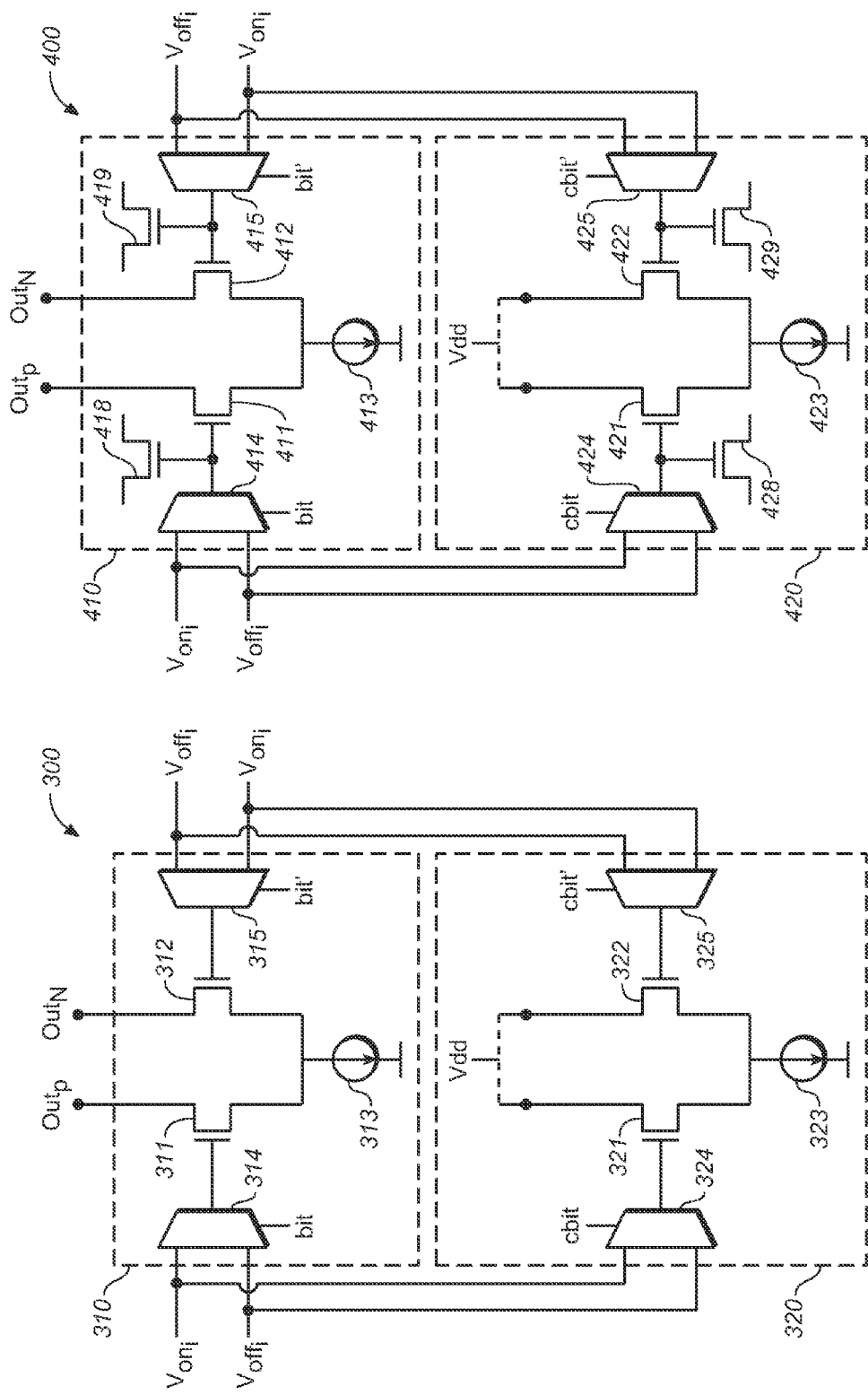

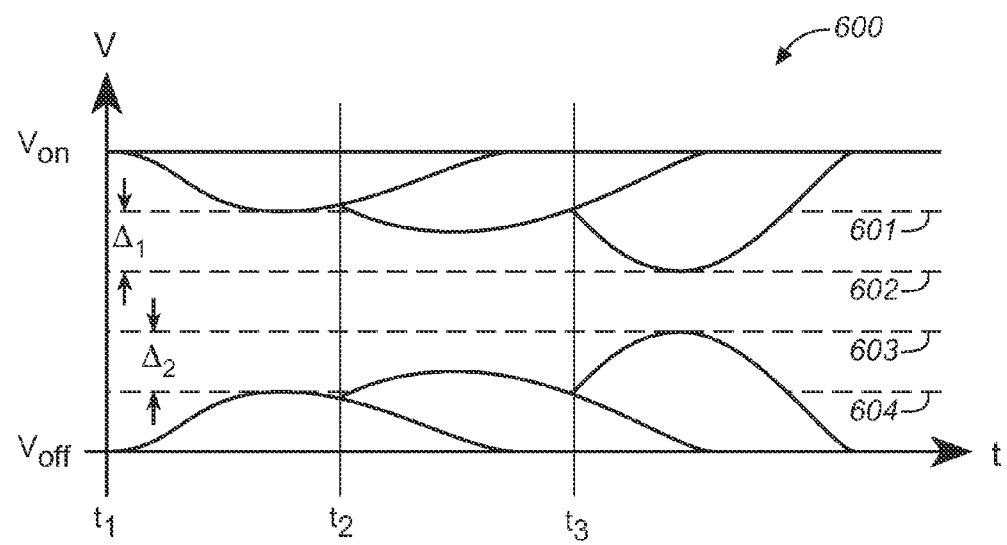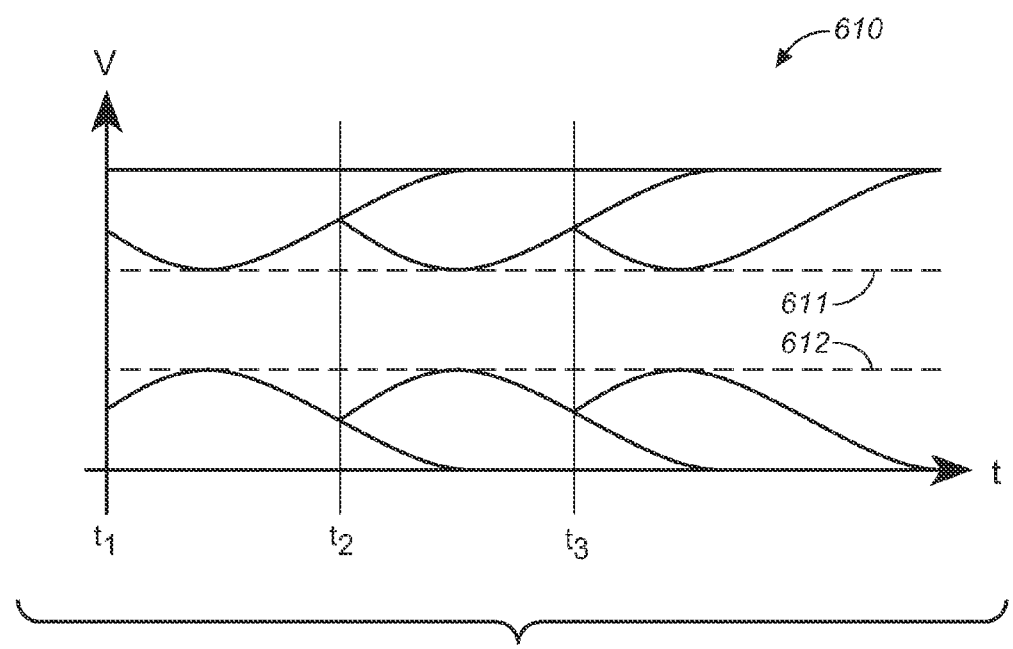
FIG. 6

DIGITAL-TO-ANALOG CONVERTER (DAC) FOR HIGH FREQUENCY AND HIGH RESOLUTION ENVIRONMENTS

CROSS-RELATED APPLICATIONS

This application claims benefit of 60/943,828, filed on Jun. 13, 2007.

BACKGROUND OF THE INVENTION

1. Field of the Invention

The present invention relates generally to electronic circuits, and more particularly, to a digital-to-analog converter (DAC) for high frequency and/or high resolution environments.

2. Description of Related Art

In general, a digital-to-analog converter (DAC) converts a digital signal representing data bits to an analog signal. The DAC can converts bits in any electronics system such as a processing device. In high frequency applications and high resolution environments, conventional DACs have many shortcomings.

A thermometer DAC contains a dedicated cell for each bit received during a cycle. The cells are similarly sized. Thus, when a transition occurs between cycles each cell draws the same amount of energy from a voltage source. However, for high resolution applications, thermometer DACs require a large area of chip space. For example, a 12-bit thermometer DAC includes 4,095 cells to represent each possible combination.

Another alternative, a binary DAC, contains fewer cells than the thermometer DAC. Neighboring cells have a binary relationship, such as 1, 2, 4, and 8. Each cell has a different size, depending on the value it represents. One main problem with the binary DACs is the integrity of the output signal when input code changes by one step and a large cell (e.g. 8x) is turned on and all previous smaller cells (e.g., 1x+2x+4x=7x) are turned off. From low frequency point of view, due to mismatch the strength of the larger cell turned on may not be just one step larger than all previous cells summed up, therefore causing non-uniform steps or sometimes even negative step (non-monotonic). From a dynamic point of view, even if there is no DC mismatch, if the turn on and off time of the cells are not well synchronized, output signal can have glitches.

Therefore, what is needed is a DAC and method for data conversion suited to operate in high resolution and/or high frequency environments.

SUMMARY OF THE INVENTION

A digital-to-analog converter (DAC) and method for data conversion. The DAC can be configured to operate in high frequency and/or high resolution environments. The DAC has a segmented architecture comprising one or more least significant bit (LSB) thermometer sub-converters and one or more most significant bit (MSB) thermometer sub-converters. A binary converter can also be added as needed for the very least significant bits.

In one embodiment, the LSB and MSB thermometer sub-converters include cell pairs with a main cell and a dummy cell. The main cell switches according to actual data transitions. Each pair is coupled to dedicated voltage buffers providing on and off voltages to the main and dummy cells. To maintain a cyclo-stationary voltage level at an output of the voltage buffers, the dummy cell is activated to simulate a transition responsive to a lack of transition in the main cell. An output of the main cell is coupled to an output of the DAC, while an output of the dummy cell is coupled to a voltage source. Thus the simulated transition by the dummy cell maintains the cyclo-stationary voltage level without affecting the DAC output.

In another embodiment, the main cells of the LSB thermometer sub-converter can each include a load matching circuit to match the input loading of the main cells of the MSB thermometer sub-converter.

BRIEF DESCRIPTION OF DRAWINGS

FIG. 3 is an exemplary circuit which implements part of the MSB thermometer sub-converter, according to one embodiment of the present invention.

FIG. 4 is an exemplary circuit which implements part of the LSB thermometer sub-converter, according to one embodiment of the present invention.

FIG. 6 is a graph illustrating voltage levels of the voltage buffers, according to one embodiment of the present invention.

DETAILED DESCRIPTION

The present invention relates generally to electronic circuits, and more particularly, to a digital-to-analog converter for operation in high resolution and high frequency environments. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

Figure 1:
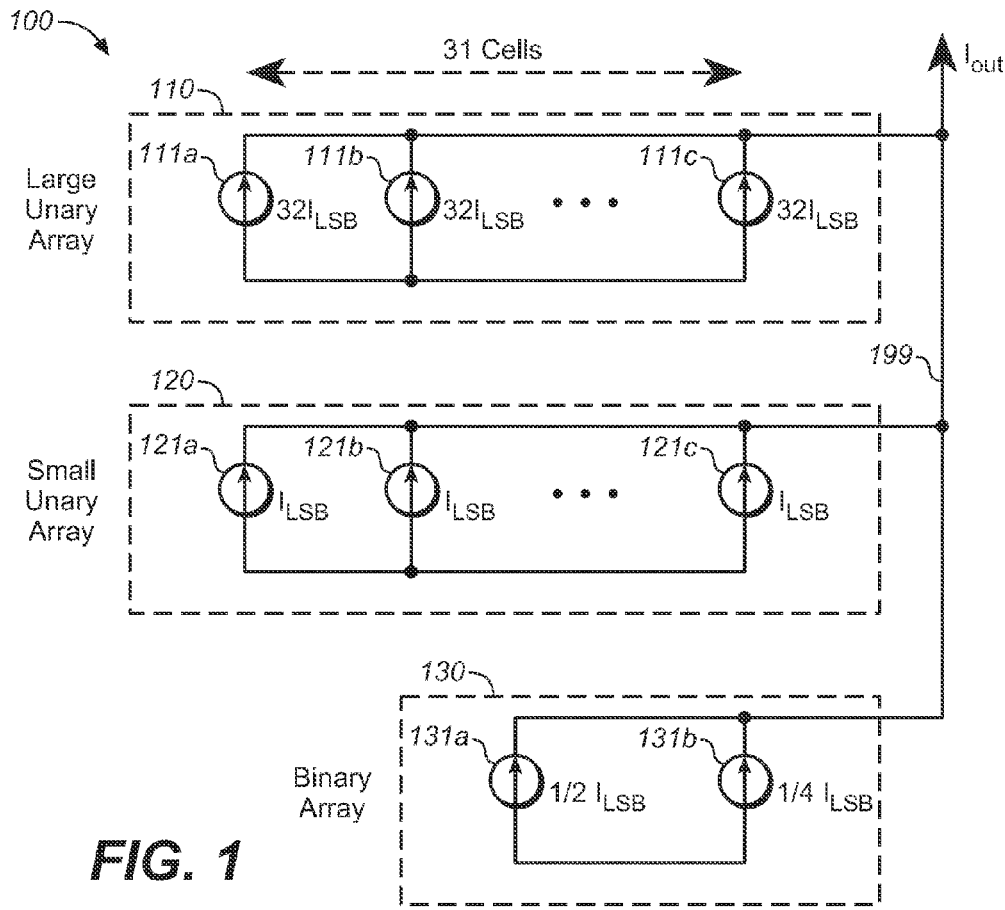
FIG. 1 is a block diagram illustrating a digital-to-analog converter (DAC) for high resolution data conversion at a high frequency, according to one embodiment of the present invention.

FIG. 1 is a block diagram illustrating a digital-to-analog converter (DAC) 100 for high resolution data conversion at a high frequency, according to one embodiment of the present invention. The DAC 100 comprises a least significant bit (MSB) thermometer sub-converter 110, a most significant bit (LSB) thermometer sub-converter 120, and a binary sub-converter 130. An output line 199 couples outputs of MSB and LSB sub-converters 110, 120, and a binary sub-converter 130, for transmitting an analog signal. An input line coupled to inputs for receiving digital signals is not shown.

The MSB thermometer sub-converter 110 further comprises an array of equal-size current sources 111a, 111b, 111c to represent cell behavior. In one example, the array includes 31 cells of the same size. Each of the current sources 111a-c produce a current of 32 LSB. The LSB thermometer sub-converter 120 further comprises an array of equal-size current sources 121a, 121b, 121c (e.g., 31) to represent cell behavior. Each of the current sources 121a-c produce a current of 1 LSB. The binary sub-converter 130 further comprises an array of binary-weighted current sources 131*a*, 131*b*, producing ½ and ¼ of the LSB current respectively.

In operation, the DAC 100 can receive, for example, 12-bits per cycle for conversion to an analog signal. The most significant 5-bits can be sent to the MSB thermometer sub-converter 110, the next 5-bits can be sent to the LSB thermometer sub-converter 120, and the final 2-bits can be sent to the binary sub-converter 130.

The embodiment of the DAC 100 in FIG. 1 employs a segmented architecture which processes bits through separate modules. By doing so, the DAC 100 saves chip space with two 5-bit DACs using 31 cells each rather than a 10-bit DAC using 1024 cells. Use of a segmented thermometer-type converter can save chip area and routing complexity over a fully thermometer-type converter. On the other hand, the 2-bit binary-type converter is more efficient for a few bits.

It will be understood that various implementations of the DAC 100 are within the scope of the present invention. For example, implementations of the DAC 100 can have more than one of either the MSB or LSB thermometer sub-converters 110, 120. In addition, the DAC 100 can be deployed within various systems either alone or in coordination with several DACs and other electronic components. In one embodiment, the DAC 100 receives a high resolution of digital bits (e.g., 10 ENOB). The DAC 100 can operate at a high frequency (e.g., 800 MHz). The DAC 100 can comprise an integrated circuit etched from silicon. The integrated circuit may contain only analog components, or may contain a combination of analog and digital components.

Figure 2:
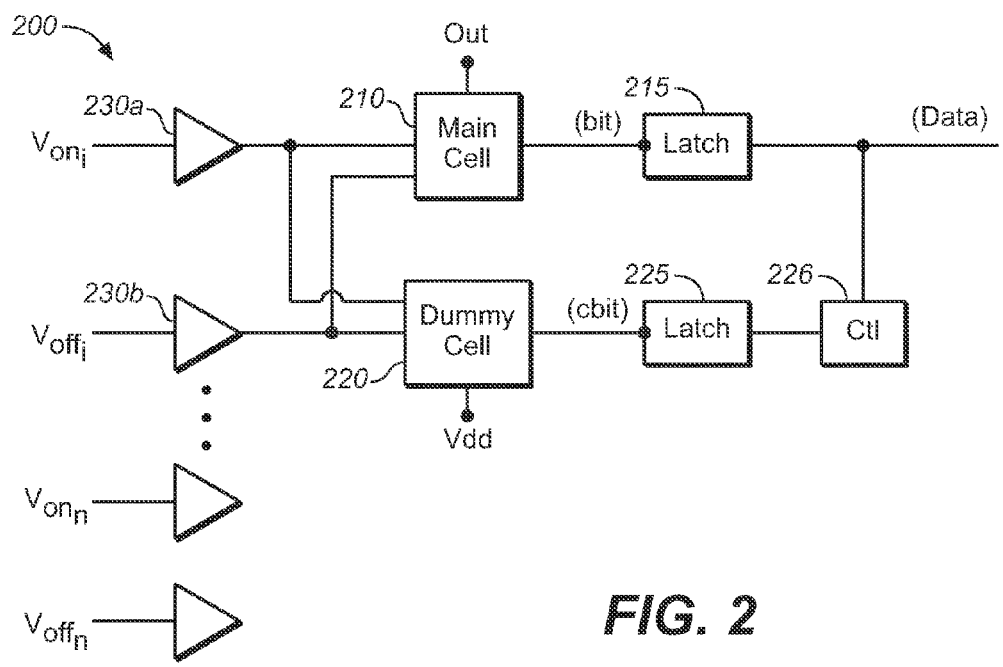
FIG. 2 is a block diagram illustrating further details of a cell in the LSB or MSB thermometer sub-converters, according to one embodiment of the present invention.

FIG. 2 is a block diagram illustrating further details of a cell 200 in the LSB or MSB thermometer sub-converters 110, 120, according to one embodiment of the present invention. The cell 200 (200 is not marked on FIG. 2) comprises a main cell 210, a dummy cell 220, voltage buffers 230*a*, 230*b*, latch 215, 225, and a controller 226. The main and dummy cells 210, 220 are coupled to an output of to the voltage buffers 230*a,b* and are coupled individually to latch 215 and latch 225, respectively. The controller 226 is disposed between the latch 225 and input data.

The main and dummy cells 210, 220 operate as a pair with respect to the voltage buffers 230*a,b*. The LSB and/or MSB thermometer sub-converters 110, 120 include, for example, 31 cells pairs. The latch 215 receives a bit from a data stream. The latch 225 receives cbit which behaves as a controlled bit. The controller 226 configures cbit according to a pattern of transitions in the data stream in order to maintain a cyclo-stationary output voltage level at the output of the buffers 230*a,b*. In one embodiment, if the data stream causes a transition in the main cell 210 between two bits, the control bit does not activate the dummy cell 220. If the data stream does not cause a transition in the main cell 210, the control bit activates the dummy cell 220 by applying a transition to the cbit. As a result, the voltage buffers 230*a,b*, in one embodiment, are stimulated each cycle either by the main cell or the dummy cell to maintain a constant voltage level.

FIG. 3 is an exemplary circuit 300 which implements part of the MSB thermometer sub-converter 110, according to one embodiment of the present invention. The circuit 300 (not marked on FIG. 3) comprises a main sub-circuit 310 implementing the main cell 210 and a dummy sub-circuit 320 implementing the dummy cell 220. The main sub-circuit 310 includes differentially-paired transistors 311, 312 coupled to a current source 313. Gates of the transistors 311, 312 are coupled to multiplexers 314, 315. The dummy sub-circuit 320 includes differentially-paired transistors 321, 322 coupled to a current source 323. Gates of the transistors 311, 312 are coupled to multiplexers 324, 325.

In operation, all multiplexers 314, 315, 324, 325 receive a dedicated Von_i and a Voff_i signal, which are buffered replica of Von and Voff, generated by the dedicated voltage buffers. Inputs bit and cbit and complementary inputs bit' and cbit' determine whether multiplexers 314, 315, 324, 325 output Von or Voff.

FIG. 4 is an exemplary circuit 400 which implements part of the LSB thermometer sub-converter 120, according to one embodiment of the present invention. The circuit 400 (not marked on FIG. 4) is similar to the circuit 300 of FIG. 3. In this respect, the circuit 400 comprises a main sub-circuit 410 implementing the main cell 210 and a dummy sub-circuit 420 implementing the dummy cell 220. Further, the main sub-circuit 410 includes differentially-paired transistors 411, 412 coupled to a current source 413. Gates of the transistors 411, 412 are coupled to multiplexers 414, 415. The dummy sub-circuit 420 includes differentially-paired transistors 421, 422 coupled to a current source 423. Gates of the transistors 411, 412 are coupled to multiplexers 424, 425.

In addition, main and dummy sub-circuit 410, 420 includes load matching transistors 418, 419, 428, 429. The load matching transistors 418, 419, 428, 429 are sized to make up a difference between input loads of the LSB cells 410 and the MSB cells 310. For example, the capacitance associated with a node of the MSB main cell 310 can be 32 times the capacitance associated with the LSB main cell 410.

Figure 5:
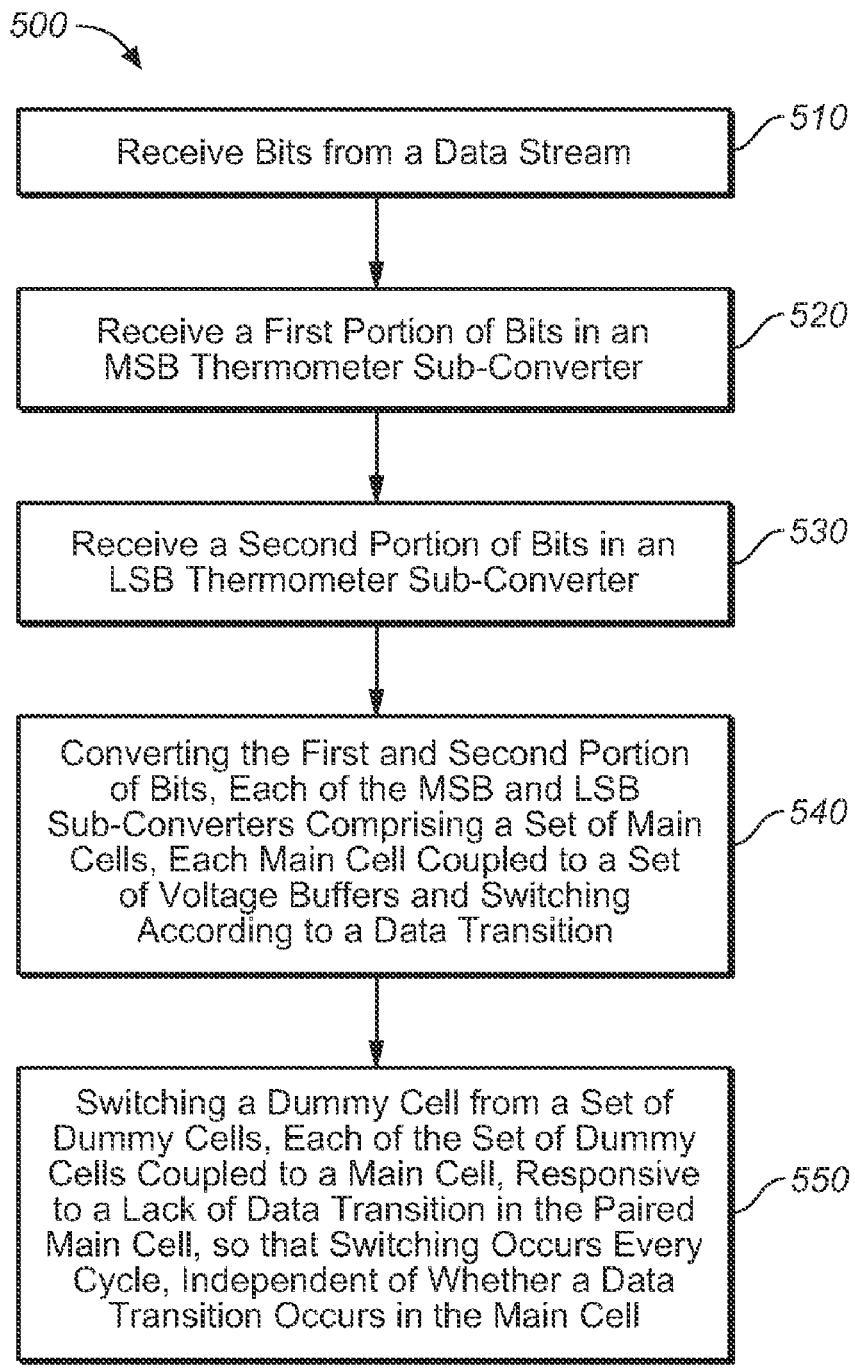
FIG. 5 is a flow chart illustrating a method for digital-to-analog conversion at a high frequency and/or at a high resolution, according to one embodiment of the present invention.

FIG. 5 is a flow chart illustrating a method 500 for digital-to-analog conversion at a high frequency and/or at a high resolution, according to one embodiment of the present invention. The method 500 can be implemented in, for example, a DAC such as the DAC 100 of FIG. 1 or some other device.

Data bits are received 510 in a DAC. A first portion of the data bits is received 50 in a most significant bit (MSB) thermometer sub-converter. A second portion of the data bits is received 530 in a least significant bit (LSB) thermometer sub-converter. The first and second portions of data bits each draw switching power from a voltage source 540. When drawing switching power from a voltage source each cycle, complementary between a pair of a main cell and a dummy cell in the MSB and LSB thermometer sub-converters, the switching power is drawn from the voltage source each cycle, independent of whether a data transition occurs in the main cell 550.

FIG. 5 is a flow chart illustrating a method 500 for digital-to-analog conversion at a high frequency and/or at a high resolution, according to one embodiment of the present invention. The method 500 can be implemented in, for example, a DAC such as the DAC 100 of FIG. 1 or some other device.

Data bits are received 510 in a DAC. A first portion of the data bits is received 520 in a most significant bit (MSB) thermometer sub-converter. A second portion of the data bits is received 530 in a least significant bit (LSB) thermometer sub-converter. The first and second portions of data bits each draw switching power from a voltage source 540. When drawing switching power from a voltage source each cycle, complementary between a pair of a main cell and a dummy cell in the MSB and LSB thermometer sub-converters, the switching power is drawn from the voltage source each cycle, independent of whether a data transition occurs in the main cell 550.

FIG. 6 is a graph illustrating voltage levels of the voltage buffers 230*a,b*, according to one embodiment of the present invention. In graph 600, the voltage levels of Von and Voff vary over time due to the switching in the DAC cells. Graph 600 shows that voltage levels diminish when there is a transition every cycle (compare voltage levels 601 to 602 for Von and 603 to 604 for Voff). Graph 610 shows the steady state that is eventually reached, also known as cyclo-stationary (i.e., voltage levels 611 and 612). A DAC operating at high resolution and high frequency has better performance when using a cyclo-stationary signal from a voltage buffer as input. However, if there is no data transition for a cycle, the voltage levels will change again. A DAC configured according to the present invention maintains a cyclo-stationary signal by forcing a transition through dummy cells when there is no actual data transition required from consecutive data bits.

Reference herein to "one embodiment", "an embodiment", or to "one or more embodiments" means that a particular feature, structure, or characteristic described in connection with the embodiments is included in at least one embodiment of the invention. Further, it is noted that instances of the phrase "in one embodiment" herein are not necessarily all referring to the same embodiment.

Certain aspects of the present invention include process steps and instructions described herein in the form of an algorithm. It should be noted that the process steps and instructions of the present invention can be embodied in software, firmware or hardware, and when embodied in software, can be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Further, the computers referred to herein may include a single processor or may be architectures employing multiple processor designs for increased computing capability.

What is claimed is:

1. A digital-to-analog converter for high frequency data conversion at a high resolution, the converter comprising:
an input configured to receive data bits;
a most significant bit (MSB) sub-converter, coupled to the input, and configured to receive a first portion of the data bits;
a least significant bit (LSB) sub-converter, coupled to the input, and configured to receive a second portion of the data bits,
wherein the MSB sub-converter and the LSB sub-converter convert the first and second portions of bits, each sub-converter comprising a set of main cells, each main cell coupled to a set of voltage buffers and switching according to a data transition, wherein each of the main cells comprises a differential current steering stage and a pair of multiplexers at an input of each of the main cells; and
a set of dummy cells, each dummy cell paired to a main cell of the MSB and LSB sub-converters and to the set of voltage buffers, the dummy cell configured to switch responsive to a lack of data transition in the paired main cell, so that switching occurs every cycle, independent of whether a data transition occurs in the main cell.

2. The digital-to-analog converter of claim 1, wherein the set of voltage buffers is dedicated to each pair of main and dummy cells.

3. The digital-to-analog converter of claim 1, wherein the LSB sub-converter further comprises a load matching circuit coupled to a node of the main cell to match the difference in input loads between the MSB and LSB sub-converters and to improve transition synchronization between the two sub-converters.

4. The digital-to-analog converter of claim 1, wherein the main and dummy cells are each coupled to a dedicated latch, the dedicated latch configured to store an input bit.

5. The digital-to-analog converter of claim 1, further comprising a controller, coupled to the dedicated latch of the dummy cell, the controller configured to cause a transition in the dummy cell responsive to a lack of data transition in the main cell.

6. The digital-to-analog converter of claim 1, wherein the data conversion occurs at a 12-bit resolution.

7. The digital-to-analog converter of claim 1, wherein data conversion in the MSB sub-converter occurs at a 5-bit resolution.

8. The digital-to-analog converter of claim 1, wherein data conversion in the LSB sub-converter occurs at a 5-bit resolution.

9. The digital-to-analog converter of claim 1, further comprising a binary sub-converter, coupled to the input and configured to receive a third portion of the data bits.

10. The digital-to-analog converter of claim 1, further comprising an output of the digital-to-analog converter coupled to outputs of the MSB and LSB sub-converters to transmit a sum of output signals.

11. A method for digital to analog conversion at a high frequency data and at a high resolution, the method comprising:
receiving data bits;
receiving a first portion of the data bits in a most significant bit (MSB) sub-converter;
receiving a second portion of the data bits in a least significant bit (LSB) sub-converter,
converting the first and second portions of bits using the MSB and LSB sub-converters, each of the MSB and LSB sub-converters comprising a set of main cells, each main cell coupled to a set of voltage buffers and switching according to a data transition, wherein each of the main cells comprises a differential current steering stage and a pair of multiplexers at an input of each of the main cells; and
switching a dummy cell from a set of dummy cells, each of the set of dummy cells coupled to a main cell, responsive to a lack of data transition in the paired main cell, so that switching occurs every cycle, independent of whether a data transition occurs in the main cell.

12. The method of claim 11, wherein the set of voltage buffers is dedicated to each pair of main and dummy cells.

13. The method of claim 11, further comprising causing a transition in the dummy cell responsive to a lack of data transition in the main cell using a controller coupled to the dedicated latch of the dummy cell.

14. The method of claim 11, wherein the data conversion occurs at a 12-bit resolution.

15. The method of claim 11, wherein data conversion in the MSB sub-converter occurs at a 5-bit resolution.

16. The method of claim 11, wherein data conversion in the LSB sub-converter occurs at a 5-bit resolution.

17. The method of claim 11, further comprising receiving a third portion of the data bits in a binary sub-converter coupled to the input.

18. The method of claim 11, further comprising transmitting a sum of output signals from an output that is coupled to outputs of the MSB and LSB sub-converters.

* * * * *